(12) United States Patent
Choi

(10) Patent No.: US 9,595,957 B2
(45) Date of Patent: Mar. 14, 2017

(54) INPUT/OUTPUT CIRCUIT, INPUT/OUTPUT NETWORK, AND INPUT/OUTPUT SYSTEM INCLUDING THE SAME

(71) Applicant: SK hynix Inc., Icheon-si, Gyeonggi-do (KR)

(72) Inventor: Joonyong Choi, Uiwang-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/989,029

(22) Filed: Jan. 6, 2016

(65) Prior Publication Data

US 2017/0019101 A1    Jan. 19, 2017

(30) Foreign Application Priority Data

Jul. 16, 2015  (KR) .................. 10-2015-0100900

(51) Int. Cl.
*H03K 3/00*        (2006.01)
*H03K 17/687*  (2006.01)
(52) U.S. Cl.
CPC .............................. *H03K 17/6871* (2013.01)
(58) Field of Classification Search
USPC .............. 327/108–109, 111–112; 326/82–83, 326/86–87
See application file for complete search history.

(56) References Cited

U.S. PATENT DOCUMENTS

| 6,353,346 B1* | 3/2002 | Chan ................... H03K 3/3565 327/112 |
| 6,624,660 B2* | 9/2003 | Li ..................... H03K 19/00315 326/83 |
| 7,224,179 B2* | 5/2007 | Kim ..................... G11C 7/1051 326/26 |
| 8,067,964 B2* | 11/2011 | Numata ........... H03K 19/00384 327/108 |
| 2004/0218423 A1 | 11/2004 | Lee et al. |
| 2012/0235732 A1 | 9/2012 | Rozen et al. |

FOREIGN PATENT DOCUMENTS

KR      1020040093838 A      11/2004

* cited by examiner

*Primary Examiner* — An Luu
(74) *Attorney, Agent, or Firm* — William Park & Associates Ltd.

(57) ABSTRACT

An input/output circuit may include a driving unit including a first transistor coupled between a power supply voltage and a first node, and a second transistor coupled in series with the first transistor through the first node at an end of the second transistor. The input/output circuit may include switch elements coupled in parallel to a second node at another end of the second transistor, and the switch elements configured to be selectively turned on in an input operation and an output operation.

20 Claims, 6 Drawing Sheets

INPUT/OUTPUT CIRCUIT, INPUT/OUTPUT NETWORK, AND INPUT/OUTPUT SYSTEM INCLUDING THE SAME

CROSS-REFERENCES TO RELATED APPLICATION

The present application claims priority under 35 U.S.C. §119(a) to Korean application number 10-2015-0100900, filed on Jul. 16, 2015, in the Korean Intellectual Property Office, which is incorporated herein by reference in its entirety.

BACKGROUND

1. Technical Field

Various embodiments generally relate to technologies for providing an input/output circuit, an input/output network, and an input/output system including the same.

2. Related Art

A semiconductor device consists of an input/output circuit for inputting and outputting a signal from and to an external element, for example, such as a host, through a pad. In this regard, a reflected signal is generated due to an impedance mismatch between the inside and outside of a pad of a semiconductor device. Therefore, the semiconductor device performs impedance matching by providing a termination resistor near the pad.

SUMMARY

In an embodiment, an input/output circuit may be provided. The input/output circuit may include a driving unit including a first transistor coupled between a power supply voltage and a first node, and a second transistor coupled in series with the first transistor through the first node at an end of the second transistor. The input/output circuit may include switch elements coupled in parallel to a second node at another end of the second transistor, and the switch elements may be configured to be selectively turned on in an input operation and an output operation.

In an embodiment, an input/output network may be provided. The input/output network may include a plurality of input/output circuits coupled with a plurality of transmission lines and input/output data through pads. Each input/output circuit may include a driving unit including a first transistor coupled between a first voltage and a first node, and a second transistor coupled between the first node and a second node. Each input/output circuit may include a fourth transistor coupled between the second node and a second voltage, and may be configured to be turned on in a first operation and provide the second voltage to the second node. Each input/output circuit may include a third transistor coupled between the second node and a third node, and may be configured to be turned on in a second operation and function as a resistor coupled to the second node. Each input/output circuit may include a differential amplifier configured to receive inputs from the first node and a first node of another input/output circuit. Third nodes of the plurality of input/output circuits may be coupled in common.

In an embodiment, an input/output system may be provided. The input/output system may include an input/output control circuit configured to generate input/output control signals. The input/output system may include an input/output circuit including switch elements coupled in parallel to a lower end of a pull-down element disposed in a driving unit, and the switch elements may be configured to be selectively turned on according to the input/output control signals.

In an embodiment, an input/output circuit may be provided. The input/output circuit may include a driving unit including a first transistor coupled between a power supply voltage and a first node, and a second transistor coupled in series with the first transistor through the first node at an end of the second transistor. The input/output circuit may include a pad coupled to the first node, and switch elements coupled in parallel to a second node at another end of the second transistor, and one of the switch elements configured to prevent the reflection of input data received from the pad.

For example, the one switch element configured to prevent the reflection of the input data received from the pad couples resistance to the second node. The other one of the switch elements is selectively turned on when data is output from the pad.

DETAILED DESCRIPTION

Figure 1:
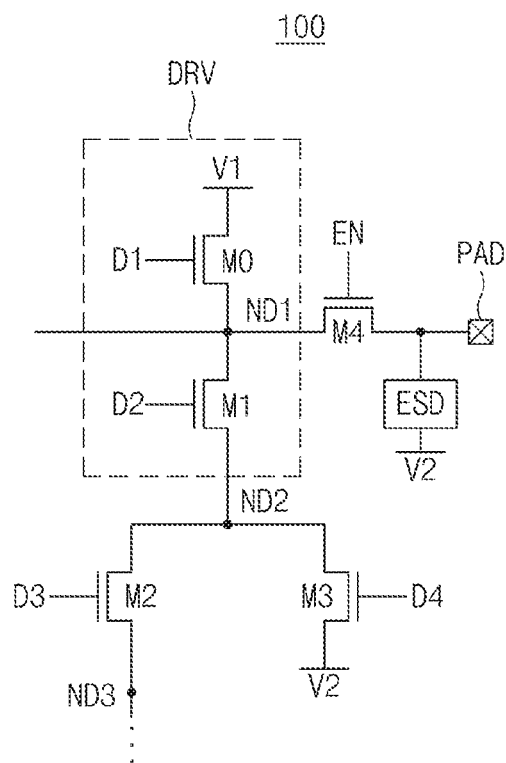
FIG. 1 is a diagram illustrating a representation of an example of an input/output circuit in accordance with an embodiment.

Hereinafter, an input/output circuit, an input/output network, and an input/output system including the same will be described below with reference to the accompanying drawings through various examples of embodiments.

Hereinafter, various examples of embodiments will be described below with reference to the accompanying drawings. The same reference numerals will be used to refer to the same components, and repeated descriptions for the same components will be omitted.

With respect to the various embodiments disclosed in the present document, specific structural and functional descriptions are merely to be illustrative for the purpose of explaining the embodiments. Various embodiments may be embodied in a variety of forms and should not be interpreted as being limited to those disclosed herein.

Expressions, such as "a first", "a second", "the first" and "the second" used in various embodiments, may describe various components irrespective of their sequence and/or importance and do not limit the corresponding components. For example, a first component may be named a second component and the second component may be named the first component without departing from the scope of the present disclosure.

Terms used in this document are used to only describe specific embodiments and may not be intended to restrict the scopes of other embodiments. An expression of a singular number includes an expression of a plural number unless clearly defined otherwise in the context.

All terms used herein, including technical terms or scientific terms, have the same meanings as those generally understood by persons of ordinary skill in the technical field to which the disclosure pertains. The terms, such as terms that are generally used and defined in dictionaries, should be construed as having meanings identical to those that are used in the context of related technology and should not be construed as having ideal or excessively formal meanings unless explicitly defined otherwise. In some embodiments, terms may not be interpreted as excluding the embodiments of the present disclosure although the terms have been defined in this document.

Various embodiments may be directed to an input/output circuit, an input/output network and an input/output system capable of performing the functions of input and output circuits by one path, minimizing an area and reducing capacitance loading.

Various embodiments may be directed to an input/output circuit, an input/output network and an input/output system including the same, capable of stably receiving data inputted through a pad from an exterior, that is, input data, even in the case where the input data has a low voltage near a DC level, and of securing the accuracy of input data.

Various embodiments may be directed to an input/output network and an input/output system capable of minimizing a space for input/output while transmitting and receiving a large amount of data through a decreased number of transmission lines and of reducing capacitance loading.

According to the embodiments, because the input/output circuit, the input/output network and the input/output system including the same do not have separate paths for input and output but may perform input and output operations through one path, an area may be minimized.

According to the embodiments, because the input/output circuit, the input/output network and the input/output system including the same are able to reduce capacitance loading while minimizing an area, signal integrity may be improved, and, as a result, a data eye may be enhanced and data input/output precision may be increased.

FIG. 1 is a diagram illustrating a representation of an example of an input/output circuit in accordance with an embodiment.

Referring to FIG. 1, an input/output circuit 100 may include a driving unit DRV which is configured by a first transistor M0 and a second transistor M1, and switch elements M2 and M3 which are coupled in parallel to the lower end (that is, a second node ND2) of the driving unit DRV.

The driving unit DRV may include the first transistor M0 which is coupled between a first voltage V1 and a first node ND1 and the second transistor M1 which is coupled between the first node ND1 and the second node ND2. In an embodiment, the first voltage V1 may correspond to a power supply voltage VDD. In an embodiment, the first transistor M0 and the second transistor M1 may correspond to NMOS transistors.

Since power consumption may be reduced in the example where an NMOS transistor is used as a pull-up element, an NMOS transistor may be used as the first transistor M0. However, it is to be noted that the embodiments are not limited to such, and the first transistor M0 may include a PMOS transistor which is widely used as a general pull-up element.

The first transistor M0 may provide the first voltage V1 to the first node ND1 by being turned on in response to a first signal D1, and the second transistor M1 may couple the first node ND1 and the second node ND2 by being turned on in response to a second signal D2.

The switch elements M2 and M3, which are selectively turned on in an input operation and an output operation, respectively, are coupled in parallel to the second node ND2. The switch elements M2 and M3 may include a third transistor M2 and a fourth transistor M3. The third transistor M2 may be turned on in response to a third signal D3, and the fourth transistor M3 may be turned on in response to a fourth signal D4.

The third transistor M2 may be coupled between the second node ND2 and a third node ND3, be turned on in response to the third signal D3 in the example where the input/output circuit 100 performs an input operation, and function as a turn-on resistor. As the second signal D2 is provided according to a value of termination resistance, the third transistor M2 may be controlled to be coupled to the first node ND1 as a turned-on resistance component.

According to an embodiment, since a signal is received through a pad PAD, in the example where the third transistor M2 performs a termination operation as a turn-on resistor, the second signal D2 may be provided such that the second transistor M1 is simultaneously turned on.

According to an embodiment, different components may be coupled to the third node ND3. Such examples of embodiments will be described later below with reference to FIGS. 2 and 3.

The fourth transistor M3 may be coupled between the second node ND2 and a second voltage V2, be turned on in response to the fourth signal D4 in the example where the input/output circuit 100 performs an output operation, and function as a pull-down element or provide the second voltage V2 to the second node ND2. For example, the second voltage V2 may correspond to a ground voltage GND.

Since an output signal is provided through the first node ND1 even in the example where the input/output circuit 100 performs an output operation, in order to perform a pull-down operation, the second transistor M1 (i.e., pull-down element disposed in the driving unit DRV) and the fourth transistor M3 may be controlled to simultaneously operate.

Operations of the input/output circuit 100 will be described below.

In the example where the input/output circuit 100 performs an input operation, that is, in the example where data is received from an external transmission device, input data is received through the first node ND1 which is coupled with the pad PAD. In the example where the input/output circuit 100 performs an input operation as described above, the third transistor M2 may be turned on in response to the third signal D3 and function as a turn-on resistor, and the turn-on resistor may function as a termination resistor for substantially preventing reflection of input data received from the pad PAD.

According to an embodiment, in the example where the input/output circuit 100 performs an input operation, the fourth transistor M3 may be turned off based on the fourth signal D4. Also, in an embodiment, the first transistor M0 may be turned off according to the first signal D1, and the second transistor M1 may be turned on in response to the second signal D2 and couple a resistor to the first node ND1.

In the example where the input/output circuit 100 performs an output operation, that is, in the example where output data is provided through the first node ND1, the fourth transistor M3 may be turned on, and provide the second voltage V2 to the second node ND2 or perform a pull-down operation.

The driving unit DRV of the input/output circuit 100 may perform a pull-up and/or pull-down operation according to output data between the first voltage V1 and the second voltage V2, and the first transistor M0, the second transistor M1 and the fourth transistor M3 may be turned on or turned off in response to the same output data.

For example, in the example where the input/output circuit 100 performs an output operation, the first, second and fourth signals D1, D2 and D4 may correspond to output data, and the third signal D3 may retain a constant value such that the third transistor M2 is turned off.

According to an embodiment, the input/output circuit 100 may further include an electrostatic discharge protection circuit ESD between the first node ND1 and the pad PAD to substantially prevent an internal circuit from being damaged due to the fact that input data or output data abruptly has a large voltage value. In addition, the input/output circuit 100 may further include an enable switch M4 which sets electrical coupling of the pad PAD and the first node ND1 of the driving unit DRV and the switch elements M2 and M3. The enable switch M4 may electrically couple the pad PAD and the first node ND1 in response to an enable signal EN.

According to an embodiment, the first to fourth signals D1, D2, D3 and D4 may be provided from an input/output control circuit (see FIGS. 4 and 5), and control the operation of the input/output circuit 100. For a scheme in which the input/output control circuit provides the first to fourth signals D1, D2, D3 and D4, descriptions will be made later with reference to FIGS. 4 and 5.

According to embodiments, the second transistor M1 may have a size relatively smaller than at least one of the switch elements M2 and M3. For example, the second transistor M1 may have a size corresponding to ⅒ of the size of the switch elements M2 and M3.

In the example where the switch elements M2 and M3 are not coupled to the second node N2, a capacitance component when viewed in terms of the input/output circuit 100 depends on only the second transistor M1. Accordingly, while the input/output circuit 100 in accordance with various embodiments has a smaller capacitance component, the input/output circuit 100 may have sufficient driving capability or perform an impedance function as the switch elements M2 and M3 are turned on in actual input/output operations.

In other words, while the input/output circuit 100 in accordance with an embodiment may perform both an input operation and an output operation, loading of a load when viewed from an exterior may be minimized as the switch elements M2 and M3 which are enabled in respective operations are coupled in parallel.

Figure 2:
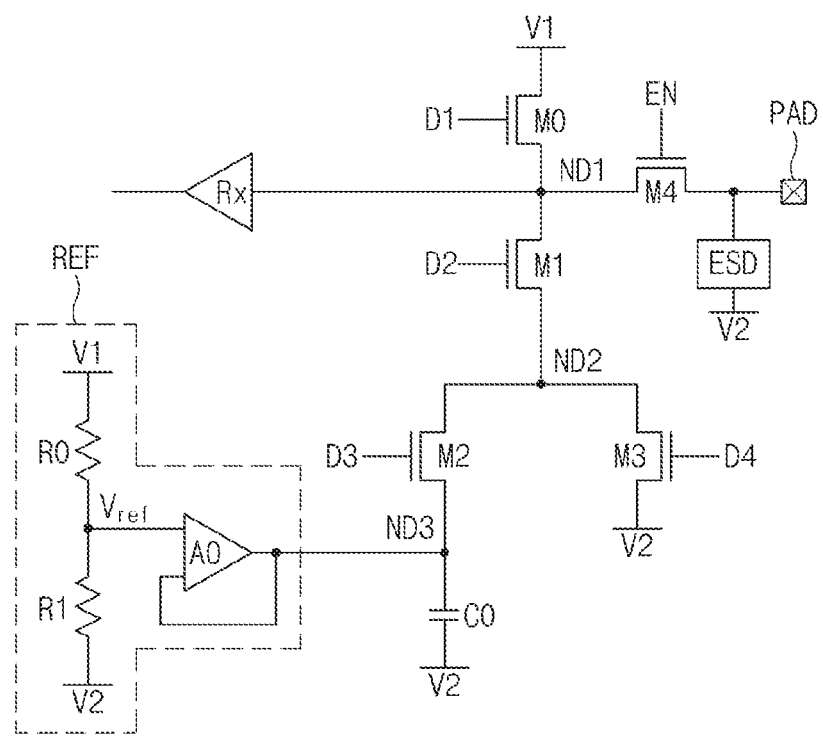
FIG. 2 is a diagram illustrating a representation of an example of an input/output circuit in accordance with an embodiment.

FIG. 2 is a diagram illustrating a representation of an example of an input/output circuit in accordance with an embodiment.

Referring to FIG. 2, an input/output circuit 100a may further include a receiver Rx which receives input data from the first node ND1 of the input/output circuit 100 described above with reference to FIG. 1, a reference voltage providing unit REF which supplies a reference voltage $V_{ref}$ to one end (the third node ND3) of the switching element turned on in an input operation, that is, the third transistor M2, and a capacitor CO.

The same reference numerals are used for the same components as in FIG. 1, and since the same components perform the same functions, descriptions thereof will be omitted herein.

Referring to FIG. 2, the reference voltage providing unit REF may include a first resistor R0 and a second resistor R1 which are coupled in series between the first voltage V1 and the second voltage V2 and provide the reference voltage $V_{ref}$, and an amplifier AO in which one input terminal of input terminals is provided with the reference voltage Vref and the other input terminal and an output terminal are coupled with each other and which provides the reference voltage Vref to the third node ND3. For example, the reference voltage providing unit REF may include a voltage regulator.

While it is illustrated in FIG. 2 that the two resistors R0 and R1 are coupled between the first voltage V1 and the second voltage V2 and provide the reference voltage $V_{ref}$ by dividing the voltage difference of the first voltage V1 and the second voltage V2 and descriptions were made based on such illustration, it is to be noted that the configuration of the reference voltage providing unit REF is not limited to such. The input/output circuit 100a in accordance with the embodiments may generate the reference voltage Vref by including other means or may be provided with the reference voltage Vref itself from an exterior.

The capacitor CO stores the reference voltage $V_{ref}$ which is provided from the reference voltage providing unit REF. Accordingly, if a voltage corresponding to input data is provided through the first node ND1, the corresponding voltage may be raised by the reference voltage $V_{ref}$. As a consequence, even when a low voltage is supplied from an exterior, the average value of the voltage may be raised by the reference voltage $V_{ref}$. Thus, voltage instability at a DC level may be minimized, and accordingly, an LVSTL (low voltage swing terminated logic) input/output operation may be performed.

In an input operation, the input/output circuit 100a receives input data through the first node ND1. The second and third transistors M1 and M2 are turned on in response to the second and third signals D2 and D3, and function as a termination resistor with respect to the input data. The fourth transistor M3 is turned off based on the fourth signal D4. The received input data may be provided to the receiver Rx and be then provided to an internal circuit such as, for example but not limited to, a memory.

In an output operation, the input/output circuit 100a outputs data through the first node ND1. According to a value of data to be outputted, the first signal D1, the second signal D2 and the fourth signal D4 may be provided. For example, if output data corresponds to data recognized as a relatively large voltage, that is, a logic high state, the first signal D1 is provided such that the first transistor M0 is turned on, and the second and fourth signals D2 and D4 may be provided such that the second transistor M1 and the fourth transistor M3 are turned off. The third signal D3 is provided such that the third transistor M2 is turned off.

According to an embodiment, in an output operation, the second and fourth signals D2 and D4 may have the same value based on the value of data and simultaneously perform a pull-down operation. In an embodiment, the fourth signal D4 may always turn on the fourth transistor M3 such that the second voltage V2 is provided to the second node ND2, and the second transistor M1 may perform a pull-down operation in response to the second signal D2.

Figure 3:
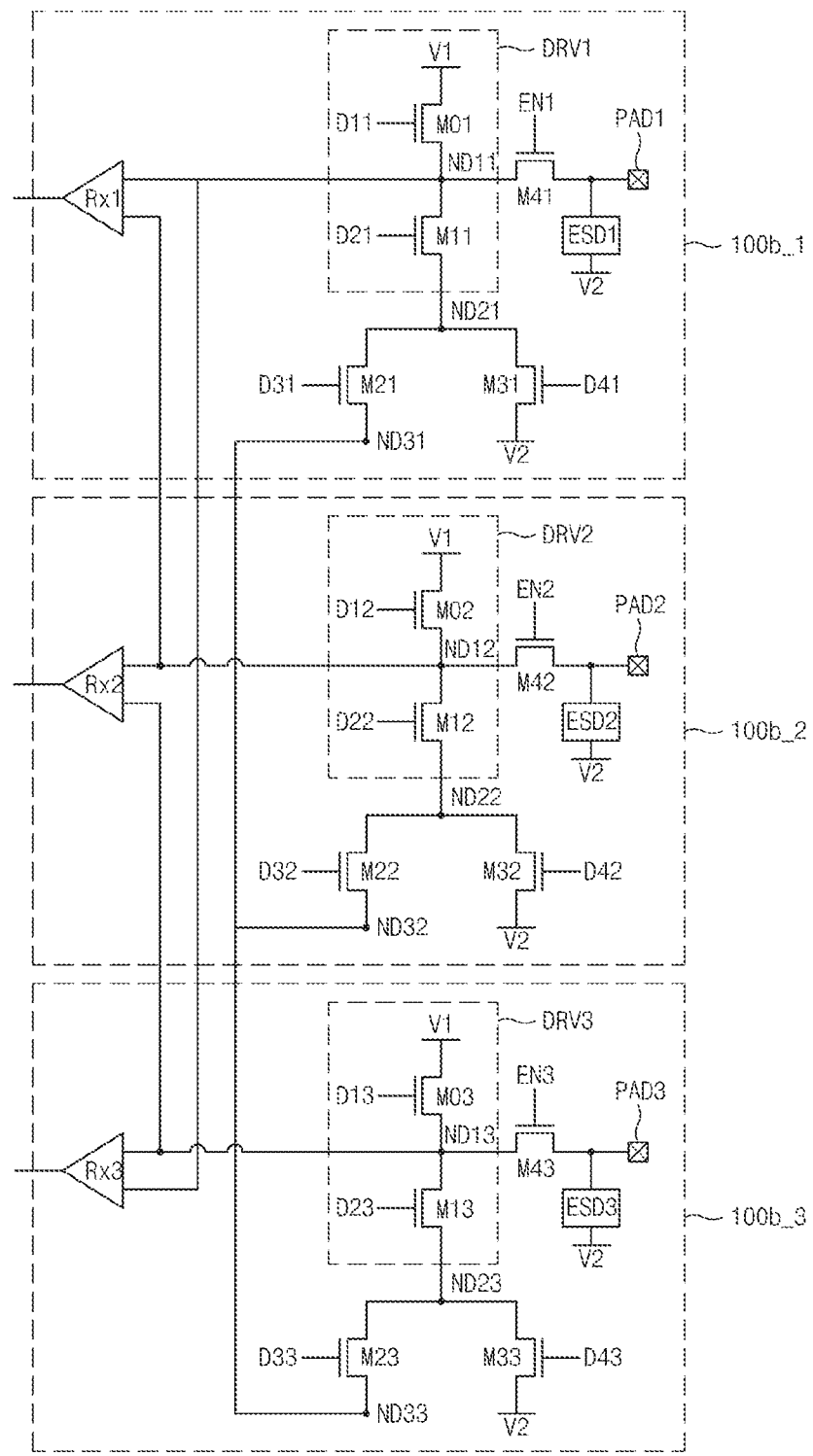
FIG. 3 is a diagram illustrating a representation of an example of an input/output network configured by input/output circuits in accordance with an embodiment.

FIG. 3 is a diagram illustrating a representation of an example of an input/output network configured by input/output circuits in accordance with an embodiment.

Referring to FIG. 3, an input/output network 10 may include a plurality of input/output circuits 100b_1, 100b_2 and 100b_3 which are coupled with a plurality of transmission lines and input/output data through pads PAD1, PAD2 and PAD3.

Hereinafter, the respective configurations of the plurality of input/output circuits 100b_1, 100b_2 and 100b_3 will be described.

The input/output circuits 100b_1, 100b_2 and 100b_3 may include driving units DRV1, DRV2 and DRV3, third transistors M21, M22 and M23, fourth transistors M31, M32 and M33, and differential amplifiers Rx1, Rx2 and Rx3.

The driving units DRV1, DRV2 and DRV3 may include first transistors M01, M02 and M03 which are coupled between a first voltage V1 and first nodes ND11, ND12 and ND13 and second transistors M11, M12 and M13 which are coupled between the first nodes ND11, ND12 and ND13 and second nodes ND21, ND22 and ND23.

For example, the first transistors M01, M02 and M03 may correspond to NMOS transistors which are applied with first signals D11, D12 and D13 through gate terminals thereof, and the second transistors M11, M12 and M13 may correspond to NMOS transistors which are applied with second signals D21, D22 and D23 through gate terminals thereof.

The third transistors M21, M22 and M23 may be coupled to the second nodes ND21, ND22 and ND23 at one ends thereof, and the other ends of the third transistors M21, M22 and M23 which are included in the plurality of input/output circuits 100b_1, 100b_2 and 100b_3 may be coupled with one another. The third transistors M21, M22 and M23 may be turned on in response to third signals D31, D32 and D33 and operate as termination resistors, in the example where the input/output network 10 performs an input operation.

The fourth transistors M31, M32 and M33 may be coupled between the second nodes ND21, ND22 and ND23 and a second voltage V2, and perform a pull-down operation by being turned on in response to fourth signals D41, D42 and D43 in the example where the input/output network 10 performs an output operation.

For example, there may be two embodiments in which the fourth transistors M31, M32 and M33 perform a pull-down operation. In one embodiment, in the example where the input/output network 10 performs an output operation, the fourth transistors M31, M32 and M33 may be always turned on and provide the second voltage V2 to the second nodes ND21, ND22 and ND23 such that the second transistors M11, M12 and M13 may perform a pull-down operation in response to the second signals D21, D22 and D23.

In another embodiment, the fourth signals D41, D42 and D43 may be the same signals, for example, have the same output data values, as the first signals D11, D12 and D13 and the second signals D21, D22 and D23. In this example, the first transistors M01, M02 and M03 may perform a pull-up operation to the first voltage V1 in response to the first signals D11, D12 and D13, and the second and fourth transistors M11, M12, M13, M31, M32 and M33 may perform a pull-down operation to the second voltage V2 in response to the second and fourth signals D21, D22, D23, D41, D42 and D43.

The differential amplifiers Rx1, Rx2 and Rx3 may receive differential inputs from the first nodes ND11, ND12 and ND13 of corresponding input/output circuits 100b_1, 100b_2 and 100b_3 and the first nodes ND12, ND13 and ND11 of other input/output circuits 100b_2, 100b_3 and 100b_1, amplify differences therebetween, and output resultant signals.

The input/output circuits 100b_1, 100b_2 and 100b_3 may further include electrostatic discharge protection circuits ESD1, ESD2 and ESD3 which are coupled between the first nodes ND11, ND12 and ND13 and the pads PAD1, PAD2 and PAD3 and discharge high voltages to the second voltage V2 in the example where the high voltages are abruptly applied through the pads PAD1, PAD2 and PAD3.

According to an embodiment, the input/output circuits 100b_1, 100b_2 and 100b_3 may further include enable switches M41, M42 and M43 which control electrical coupling between the PAD1, PAD2 and PAD3 and the first nodes ND11, ND12 and ND13. The enable switches M41, M42 and M43 may electrically couple the pads PAD1, PAD2 and PAD3 and the first nodes ND11, ND12 and ND13 in response to enable signals EN1, EN2 and EN3.

According to an embodiment, the input/output network 10 illustrated in FIG. 3 may be coupled to an input/output interface. For example, the input/output network 10 illustrated in FIG. 3 may be coupled to an input/output interface provided in C-PHY introduced by MIPI Alliance. According to this fact, the input/output network 10 may be configured to include three input/output circuits 100b_1, 100b_2 and 100b_3, and, in the example where the input/output network 10 performs an input operation, input data may not be provided to at least one of the three input/output circuits 100b_1, 100b_2 and 100b_3.

The differential amplifiers Rx1, Rx2 and Rx3 included in the input/output circuits 100b_1, 100b_2 and 100b_3 may receive input data by recognizing the polarity differences of the first nodes ND11, ND12 and ND13, and may recognize at least six states in the example where input data of 3 bits are received through the pads PAD1, PAD2 and PAD3 by the polarity differences.

In a manner similar to that described above with reference to FIGS. 1 and 2, the input/output network 10 illustrated in FIG. 3 includes the third transistors M21, M22 and M23 and the fourth transistors M31, M32 and M33 which are enabled in an input operation and an output operation, respectively, at the lower ends of the second nodes ND21, ND22 and ND23. Since the input/output network 10 has substantially the same operation characteristic as described above with respect to the operations of the third transistors M21, M22 and M23 and the fourth transistors M31, M32 and M33, descriptions thereof will be omitted herein. In a manner similar to that described above with reference to FIGS. 1 and 2, the input/output network 10 illustrated in FIG. 3 includes the third nodes ND31, ND32, and ND33, the third transistors M21, M22 and M23 may be coupled between second nodes ND21, ND22 and ND23 and the third nodes ND31, ND32, and ND33, respectively.

Figure 4:
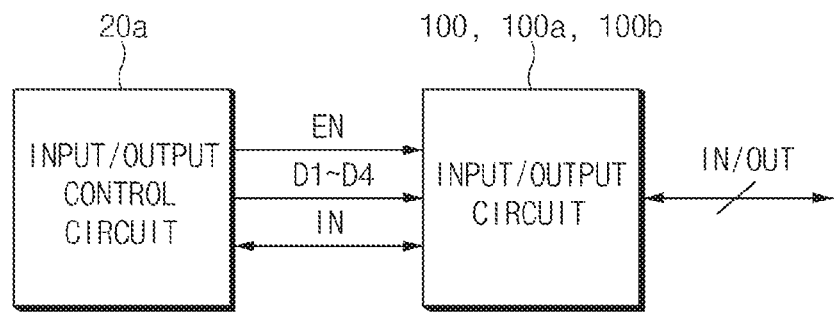
FIG. 4 is a block diagram illustrating a representation of an example of an input/output system in accordance with an embodiment.

FIG. 4 is a block diagram illustrating a representation of an example of an input/output system in accordance with an embodiment.

Referring to FIG. 4, an input/output system 1a in accordance with an embodiment may include an input/output control circuit 20a and an input/output circuit 100, 100a or 100b.

The input/output circuit 100, 100a or 100b has substantially the same configuration as described above with reference to FIGS. 1 to 3, and performs an input/output operation based on first to fourth signals D1, D2, D3 and D4 provided from the input/output control circuit 20a.

The input/output control circuit 20a generates input/output control signals, and provides the generated input/ output control signals to the input/output circuit 100, 100a or 100b. The input/output control signals may include the first to fourth signals D1, D2, D3 and D4 and an enable signal EN.

According to an embodiment, the input/output control circuit 20a may generate the input/output control signals based on an operation mode or may generate the input/output control signals based on an operation mode and output data.

In the example where input data IN is received from an exterior, the input/output circuit 100, 100a or 100b is coupled with the pad PAD in response to the enable signal EN included in the input/output control signals, and receives the input data IN through the first node ND1. At this time, the third transistor M2 may be turned on in response to the third signal D3 included in the input/output control signals and function as a termination resistor for the input data IN, and the second signal D2 may be generated according to a termination resistance value.

According to an embodiment, in the case where the input data IN is received from an exterior, the first and fourth transistors M0 and M3 included in the input/output circuit 100, 100a or 100b may be turned off based on the first and fourth signals D1 and D4 included in the input/output control signals.

In the example where output data OUT is provided to an exterior, the input/output control circuit 20a may generate the first, second and fourth signals D1, D2 and D4 and the enable signal EN included in the input/output control signals, based on the output data OUT. According to an embodiment, the input/output control circuit 20a may turn off the third transistor M2 by providing the third signal D3 included in the input/output control signals.

The input/output control circuit 20a may generate the input/output control signals according to whether the input/output system 1a performs an input operation or an output operation, that is, according to an operation mode. The input/output control circuit 20a may generate the input/output control signals according to output data in the example where the input/output system 1a performs an output operation.

Figure 5:
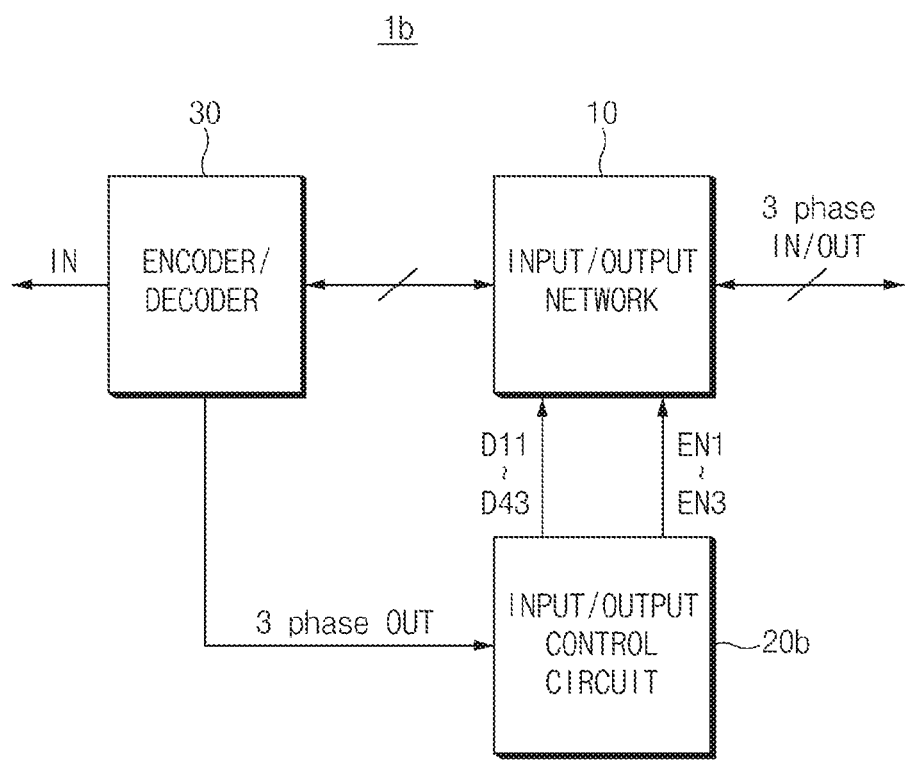
FIG. 5 is a block diagram illustrating a representation of an example of an input/output system including an input/output network in accordance with an embodiment.

FIG. 5 is a block diagram illustrating a representation of an example of an input/output system including an input/output network in accordance with an embodiment.

Referring to FIG. 5, an input/output system 1b may include the input/output network 10 illustrated in FIG. 3, an input/output control circuit 20b, and an encoder/decoder 30.

The input/output network 10 transmits and receives 3 phase input/output data to/from an external device such as a host.

The input/output control circuit 20b may generate input/output control signals D11 to D43 and EN1 to EN3, based on an operation mode of the input/output system 1b and output data.

For example, where the input/output network 10 receives 3 phase input data from the external device, the input/output control circuit 20b turns on the enable switches M41, M42 and M43 through the enable signals EN1, EN2 and EN3 such that the 3 phase input data are provided to the first nodes ND11, ND12 and ND13 through the pads PAD1, PAD2 and PAD3, and turns off the first transistors M01, M02 and M03 and the fourth transistors M31, M32 and M33 by generating first signals D11, D12 and D13 and fourth signals D41, D42 and D43.

Further, for example, the input/output control circuit 20b causes the second and third transistors M11, M12, M13, M21, M22 and M23 to perform a termination operation, by generating second signals D21, D22 and D23 and third signals D31, D32 and D33.

Signals differentially amplified through such a process are decoded through the encoder/decoder 30 and are outputted as input signal IN. The outputted input signal IN may be written in a memory of a semiconductor device which includes the input/output system 1b.

In the example where the input/output network 1b provides 3 phase output data, 3 phase output data 3 phase OUT encoded through the encoder/decoder 30 may be provided to the input/output control circuit 20b.

As described above, for example, the input/output control circuit 20b may generate the first, second and fourth signals D11, D12, D13, D21, D22, D23, D41, D42 and D43 based on output data in an output operation, and the third signals D31, D32 and D33 are generated to turn off the third transistors M21, M22 and M23.

Moreover, for example, the input/output control circuit 20b couples the first nodes ND11, ND12 and ND13 and the pads PAD1, PAD2 and PAD3 by generating the enable signals EN1, EN2 and EN3 such that the 3 phase output data may be provided to the external device through the input/output network 10.

As described above, in the input/output circuit, the input/output network and the input/output system in accordance with the embodiments, since input data and output data are transmitted and received through the same path in the example where input and output operations are performed, an area needed for the entire input and output operations may be minimized.

In addition, in the input/output circuit, the input/output network and the input/output system in accordance with the embodiments, it may be possible to minimize capacitance loading in the example where the input/output circuit, the input/output network and the input/output system are realized such that input and output operations are performed through one path. As a consequence, even in the example where an input/output operation is performed quickly, a data eye may be sufficiently secured, and data input/output precision may be improved.

Figure 6:
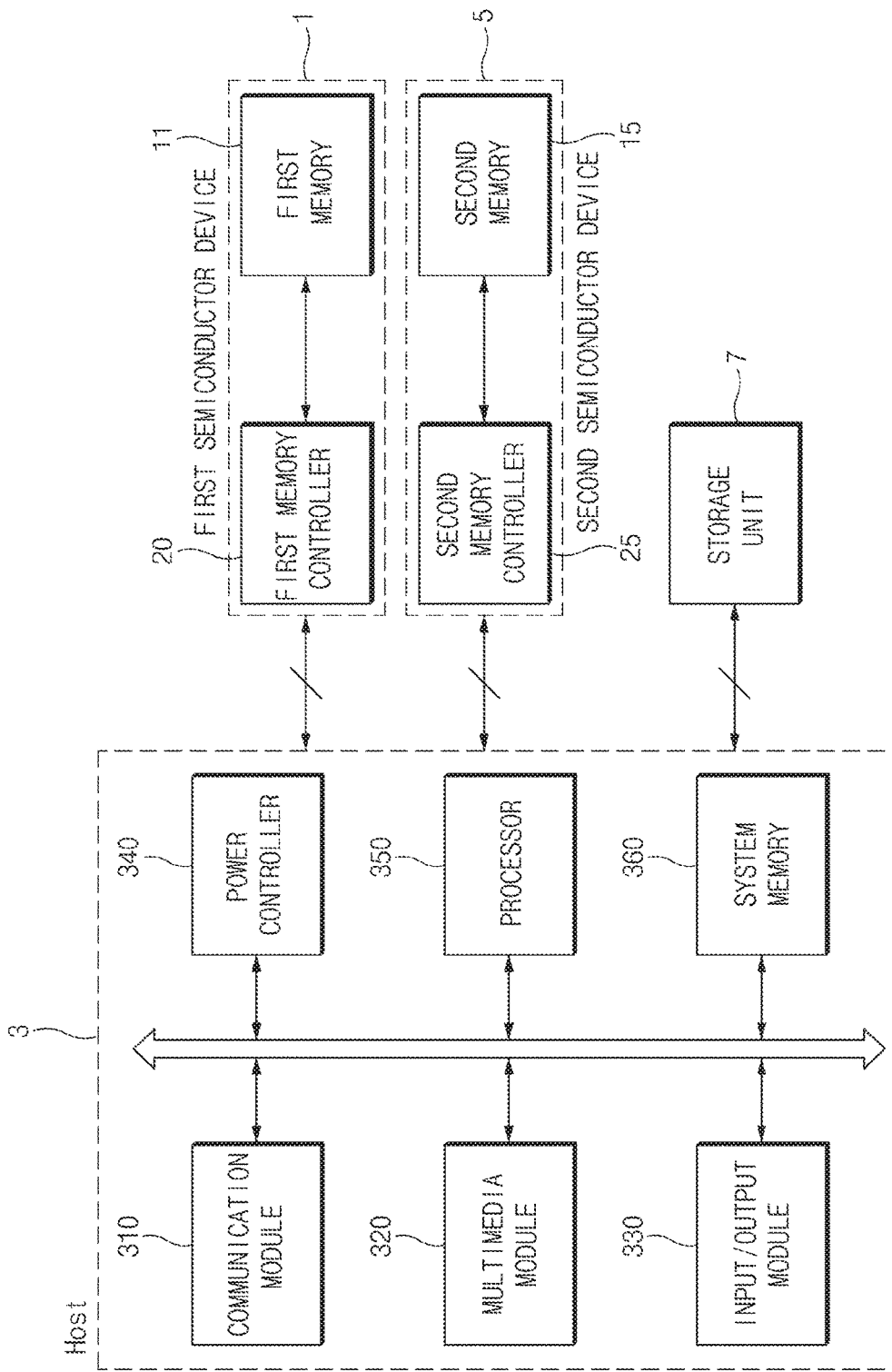
FIG. 6 is a block diagram illustrating a representation of an example of the configuration of an electronic device in accordance with an embodiment.

FIG. 6 is a block diagram illustrating a representation of an example of the configuration of an electronic device in accordance with an embodiment.

An electronic device may mean a computing device or system which may execute computer-readable commands. Examples of the electronic device may include workstations, laptops, client-side terminals, servers, distributed computing systems, handheld devices, video game consoles, and the likes.

Referring to FIG. 6, the electronic device may include a host 3, a first semiconductor device 1, and a second semiconductor device 5. The host 3 may include modules capable of performing various functions, such as a processor 350, a system memory 360, a power controller 340, a communication module 310, a multimedia module 320 and an input/output module 330. The host 3 may further include a system bus for coupling among the respective modules.

The input/output module 330 may include the input/output is circuit 100, 100a or 100b or the input/output network 10 in accordance with the embodiments. According to an embodiment, the input/output control circuit 20a or 20b in accordance with the embodiments may be included in the processor 350 or may be realized in the input/output module 330.

The processor 350 may execute an operating system in the electronic device, perform various calculation functions, and control the system memory 360, the power controller 340, the communication module 310, the multimedia module 320 and the input/output module 330 which are included in the host 3, the first semiconductor device 1, the second semiconductor device 5, and a storage unit 7.

As described above, the processor 350 may include the input/output control circuit 20a or 20b in accordance with the embodiments, and may generate input/output control signals based on an operation mode of the input/output circuit 100, 100a or 100b or the input/output network 10 and output data and provide the generated input/output control signals to the input/output module 330.

The processor 350 may include a central processing unit (CPU), a graphic processing unit (GPU), a multimedia processor (MMP) or a digital signal processor (DSP). Furthermore, the processor 350 may be realized in the form of a System On Chip by combining processor chips having various functions, such as application processors (AP).

The system memory 360 may store information on the operating system, store data processed by the processor 350, and store data generated as a calculation result of the processor 350.

The power controller 340 may adjust a power supply amount so as to supply power appropriate for the processor 350 and respective components in the electronic device to operate and function. The power controller 340 may include a power management IC (PMIC) or the like. The power controller 340 may be supplied with power from outside the electronic device or may be supplied with power from a battery (not illustrated) in the electronic device.

The communication module 310 may perform signal transmission and reception between the processor 350 and a device outside the electronic device according to various communication protocols. The communication module 310 may include a module capable of being coupled with a wired network and a module capable of being coupled with a wireless network. The wired network module may perform signal transmission and reception in a communication scheme such as LAN (local area network), Ethernet and PLC (power line communication), and the wireless network module may perform signal transmission and reception in a communication scheme such as Bluetooth, RFID (radio frequency identification), LTE (long term evolution), Wibro (wireless broadband Internet) and WCDMA (wideband CDMA).

The multimedia module 320 may perform calculation or is input/output of multimedia data according to the control of the processor 350. The multimedia module 320 may input/output multimedia data by being coupled to a camera device, an audio device, a 2D or 3D graphic device, a display device or an A/V output device.

The input/output module 330 may receive a signal and output a specific signal to a user through a user interface. The input/output module 330 may receive a signal by being coupled to a keyboard, a keypad, a mouse, a stylus, a microphone, a resistive touch screen device or a capacitive touch screen device, and may output a signal through a speaker, an earphone, a printer or a display device.

The input/output circuit 100, 100a or 100b or the input/ output network 10 in accordance with the embodiments may include switch elements which are coupled in parallel to one node and are selectively enabled in an input operation and an output operation. As a consequence, capacitance loading may be minimized in the example where a plurality of transmission lines are needed, and realization of a small size becomes possible.

The first semiconductor device 1 may store data received from the host 3 or output stored data to the host 3, according to the control of the processor 350 included in the host 3. The first semiconductor device 1 may include at least one first memory controller 20 and at least one first memory 11.

While not illustrated, the first semiconductor device 1 may is include the input/output circuit 100, 100a or 100b, the input/output network 10 or the input/output system 1a or 1b in accordance with the embodiments. For example, the first semiconductor device 1 may perform the operation of providing data stored in the first memory 11 to the host 3 or writing data received from the host 3 in the first memory 11, through the input/output circuit 100, 100a or 100b, the input/output network 10 or the input/output system 1a or 1b.

The first memory controller 20 may transmit information or signals such as a clock (CLK), a command/address (CA), a data strobe signal (DQS) and data (DATA) to the first memory 11, as the occasion demands, in order to control the data input/output operation of the first memory 11 according to the control of the processor 350 included in the host 3. Such information or signals may be transmitted through the same channel or different channels.

The first memory 11 may input/output an input signal (DIN) in response to the clock (CLK), the command/address (CA) and the data strobe signal (DQS) which are applied from the first memory controller 20. The first memory 11 may be realized by a volatile memory device such as an SRAM (static RAM), a DRAM (dynamic RAM) and an SDRAM (synchronous DRAM).

The second semiconductor device 5 may operate or function as a memory system which is capable of quickly recognizing a control signal received from the host 3 and starting an operation corresponding to the received control signal. The second is semiconductor device 5 may include at least one second memory controller 25 and at least one second memory 15. While not illustrated, the second semiconductor device 5 may include the input/output circuit 100, 100a or 100b, the input/output network 10 or the input/ output system 1a or 1b in accordance with the embodiments.

The second memory controller 25 may be coupled with the second memory 15 through at least one channel. The second memory controller 25 may control read, program and erase operations of the second memory 15 according to the control of the processor 350.

The second memory 15 may be coupled with the second memory controller 25 through a plurality of channels. The second memory 15 may include at least one among nonvolatile memory devices such as a ROM (read only memory), a PROM (programmable ROM), an EEPROM (electrically erasable and programmable ROM), an EPROM (electrically programmable ROM), a flash memory, a PRAM (phase change RAM), an MRAM (magnetic RAM), an RRAM (resistive RAM) and an FRAM (ferroelectric RAM). At least one nonvolatile memory device may be coupled to one channel. Nonvolatile memory devices coupled to one channel may be coupled to the same control signal bus and data bus.

The electronic device may include the storage unit 7 for storing large data or may use a storage unit outside the electronic device. The storage unit 7 may include a large capacity information storage device for storing data and commands for various components of the electronic device. The storage unit 7 may be realized by a device such as at least one HDD or flash-based SSD.

The respective components illustrated in FIG. 6 are classified in terms of functions thereof, but are not realized to be necessarily physically distinguished from one another. For example, at least two components among the components of FIG. 6 may be formed in one physical semiconductor chip or may be included in a single package.

While various embodiments have been described above, it will be understood to those skilled in the art that the embodiments described are by way of example only. Accordingly, the input/output circuit, the input/output network, and the input/output system including the same described herein should not be limited based on the described embodiments.

What is claimed is:

1. An input/output circuit comprising:
a driving unit including a first transistor coupled between a power supply voltage and a first node, and a second transistor coupled in series with the first transistor through the first node at an end of the second transistor; and
switch elements coupled in parallel to a second node at another end of the second transistor, and the switch elements configured to be selectively turned on in an input operation and an output operation.

2. The input/output circuit according to claim 1, wherein a switch element which is turned on in the output operation provides a ground voltage to the second node.

3. The input/output circuit according to claim 2, wherein the is driving unit inputs and outputs data from and to a pad through the first node.

4. The input/output circuit according to claim 3, further comprising:
a reference voltage providing unit configured to provide a reference voltage to one end of a switch element which is turned on in the input operation; and
a capacitor coupled to the reference voltage providing unit.

5. The input/output circuit according to claim 3, wherein the first and second transistors perform a pull-up operation and a pull-down operation, respectively, in response to data which is outputted in the output operation.

6. The input/output circuit according to claim 3, further comprising:
an electrostatic discharge protection circuit disposed between the pad and the first node.

7. The input/output circuit according to claim 3, wherein at least one of the switch elements has a larger size than the second transistor.

8. An input/output network including a plurality of input/output circuits coupled with a plurality of transmission lines and input/output data through pads, each input/output circuit comprising:
a driving unit including a first transistor coupled between a first voltage and a first node, and a second transistor coupled between the first node and a second node;
a fourth transistor coupled between the second node and a second voltage, and configured to be turned on in a first operation and provide the second voltage to the second node;
a third transistor coupled between the second node and a third node, and configured to be turned on in a second operation and function as a resistor coupled to the second node; and
a differential amplifier configured to receive inputs from the first node and a first node of another input/output circuit,
wherein third nodes of the plurality of input/output circuits are coupled in common.

9. The input/output network according to claim 8, wherein three input/output circuits are included.

10. The input/output network according to claim 9, wherein the first voltage corresponds to a power supply voltage, and the second voltage corresponds to a ground voltage.

11. The input/output network according to claim 10, wherein the first operation corresponds to an input operation, and the second operation corresponds to an output operation.

12. The input/output network according to claim 11, wherein, in the output operation, the first and second transistors perform a pull-up operation and a pull-down operation, respectively, in response to data to be outputted.

13. The input/output network according to claim 11, wherein, in the input operation, at least one of the input/output circuits does not receive input data through the pad.

14. An input/output system comprising:
an input/output control circuit configured to generate input/output control signals; and
an input/output circuit including switch elements coupled in parallel to a lower end of a pull-down element disposed in a driving unit, and the switch elements configured to be selectively turned on according to the input/output control signals.

15. The input/output system according to claim 14, wherein the switch elements comprise:
a first transistor configured to be turned on in an input operation based on the input/output control signals; and
a second transistor configured to be turned on in an output operation based on the input/output control signals.

16. The input/output system according to claim 15, wherein the input/output control circuit generates the input/output control signals according to output data and an operation mode.

17. The input/output system according to claim 15, wherein at least one of the first and second transistors has a size larger than the pull-down element disposed in the driving unit.

18. The input/output system according to claim 15, wherein the pull-down element is turned on in the input operation based on the input/output control signals.

19. The input/output system according to claim 15, further comprising:
a reference voltage providing unit configured to provide a reference voltage to a terminal other than a terminal through which the third transistor is coupled with the pull-down element; and
a capacitor coupled between the terminal to which the reference voltage providing unit is coupled and a ground voltage.

20. The input/output system according to claim 15, wherein the second transistor provides the ground voltage to the pull-down element in response to the input/output control signals.

* * * * *